(12) United States Patent
Gotsick et al.

(10) Patent No.: US 8,871,431 B2
(45) Date of Patent: *Oct. 28, 2014

(54) LAMINATED FLEXOGRAPHIC PRINTING SLEEVES AND METHODS OF MAKING THE SAME

(76) Inventors: Timothy Gotsick, Acworth, GA (US);
David A. Recchia, Smyrna, GA (US);
Ryan W. Vest, Cumming, GA (US)

( * ) Notice: Subject to any disclaimer, the term of this patent is extended or adjusted under 35 U.S.C. 154(b) by 47 days.

This patent is subject to a terminal disclaimer.

(21) Appl. No.: 13/205,107

(22) Filed: Aug. 8, 2011

(65) Prior Publication Data

US 2013/0040243 A1    Feb. 14, 2013

(51) Int. Cl.
| | |
|---|---|
| *G03F 7/00* | (2006.01) |
| *G03F 7/26* | (2006.01) |
| *G03F 7/20* | (2006.01) |
| *G03F 7/34* | (2006.01) |

(52) U.S. Cl.
CPC ... *G03F 7/20* (2013.01); *G03F 7/34* (2013.01)
USPC ........ 430/306; 430/270.1; 430/309; 430/329; 430/330; 101/395

(58) Field of Classification Search
CPC ........... G03F 7/202; G03F 7/092; G03F 7/20; G03F 7/11; G03F 9/00; G03F 7/34; B41C 1/055; B41M 1/04; B41M 2205/06; B41M 5/41; B41M 2205/14; B41N 1/12; B41N 1/16
USPC ......................................................... 430/306
See application file for complete search history.

(56) References Cited

U.S. PATENT DOCUMENTS

| | | |
|---|---|---|
| 3,264,103 A | 8/1966 | Cohen et al. |
| 3,265,765 A | 8/1966 | Holden et al. |
| 3,867,153 A | 2/1975 | MacLachlan |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |

(Continued)

FOREIGN PATENT DOCUMENTS

| | | |
|---|---|---|
| EP | 0 196 443 | 5/1990 |
| EP | 0 456 336 | 11/1991 |

(Continued)

*Primary Examiner* — Chanceity Robinson
(74) *Attorney, Agent, or Firm* — Carmody Torrance Sandak & Hennessey LLP

(57) ABSTRACT

A method of tailoring the shape of a plurality of relief dots created in a photosensitive printing blank during a digital platemaking process is provided. The photosensitive printing blank comprises a laser ablatable mask layer disposed on at least one photocurable layer which is mountable on a printing sleeve. The method comprises the steps of (1) laser ablating the laser ablatable mask layer to create an in situ negative in the laser ablatable layer; (2) placing a barrier layer on top of the laser ablatable mask layer; (3) exposing the at least one photocurable layer to actinic radiation through the barrier layer and the in situ negative; (4) removing the barrier layer; and (5) developing the imaged and exposed photosensitive printing blank to reveal the relief image therein, the relief image comprising the plurality of relief dots. The presence of the barrier layer produces printing dots having desired geometric characteristics.

17 Claims, 3 Drawing Sheets

(56) References Cited

U.S. PATENT DOCUMENTS

| | | |
|---|---|---|
| 4,622,088 A | 11/1986 | Min |
| 4,685,393 A | 8/1987 | Saueressig |
| 5,135,827 A | 8/1992 | Bohm et al. |
| 5,175,072 A | 12/1992 | Martens |
| 5,223,375 A | 6/1993 | Berrier et al. |
| 5,262,275 A | 11/1993 | Fan |
| 5,279,697 A | 1/1994 | Peterson et al. |
| 5,506,086 A * | 4/1996 | Van Zoeren ............... 430/201 |
| 5,614,315 A * | 3/1997 | Kondo et al. ............... 428/332 |
| 5,916,403 A | 6/1999 | Cushner et al. |
| 5,925,500 A | 7/1999 | Yang |
| 6,238,837 B1 * | 5/2001 | Fan ............... 430/273.1 |
| 6,742,453 B1 | 6/2004 | Borski |
| 6,773,859 B2 | 8/2004 | Fan et al. |
| 6,864,039 B2 * | 3/2005 | Cheng et al. ............... 430/273.1 |
| 6,966,259 B2 * | 11/2005 | Kanga et al. ............... 101/395 |
| 7,041,432 B2 | 5/2006 | Markhart |
| 7,081,331 B2 | 7/2006 | Vest |
| 7,122,295 B2 | 10/2006 | Mengel et al. |
| 7,232,649 B2 | 6/2007 | Vest |
| 7,237,482 B2 | 7/2007 | Vest et al. |
| 7,316,183 B2 | 1/2008 | Lorig et al. |
| 7,935,401 B2 | 5/2011 | Opuszko et al. |
| 2004/0060647 A1 | 4/2004 | Tabora |
| 2010/0143840 A1 * | 6/2010 | Veres et al. ............... 430/270.1 |
| 2011/0079158 A1 * | 4/2011 | Recchia et al. ............... 101/395 |

FOREIGN PATENT DOCUMENTS

| | | |
|---|---|---|
| EP | 0 640 878 | 3/1995 |
| EP | 1 239 329 | 9/2002 |
| GB | 1 366 769 | 9/1974 |
| WO | 01/18604 | 3/2001 |
| WO | 01/88615 | 11/2001 |

* cited by examiner

LAMINATED FLEXOGRAPHIC PRINTING SLEEVES AND METHODS OF MAKING THE SAME

FIELD OF THE INVENTION,

The present invention relates generally to cylindrical flexographic relief image printing elements and methods of processing the same for optimal printing on various substrates.

BACKGROUND OF THE INVENTION

Flexographic printing elements are relief plates with image elements raised above open areas. Generally, the elements are somewhat soft, and flexible enough to wrap around a printing cylinder, and durable enough to print over a million copies. Such plates offer a number of advantages to the printer, based especially on their durability and the ease with which they can be made.

Flexography is commonly used for high-volume runs. Flexography can be advantageously employed for printing on a variety of substrates such as paper, paperboard stock, corrugated board, films, foils and laminates. Newspapers and grocery bags are prominent examples. Coarse surfaces and stretch films can be economically printed only by means of flexography. However, due to product competition, the market requirements on the printing quality of the images on the packaging can be very stringent.

A typical flexographic printing plate as delivered by its manufacturer, is a multi-layered article made of, in order, a backing or support layer, one or more unexposed photocurable layers, a protective layer or slip film, and a cover sheet.

Although photopolymer printing elements are typically used in "flat" sheet form, there are particular applications and advantages to using the printing element in a continuous cylindrical form, as a continuous in-the-round (CITR) photopolymer sleeve. CITR photopolymer sleeves add the benefits of digital imaging, accurate registration, fast mounting, and no plate lift to the flexographic printing process. CITR sleeves have applications in the flexographic printing of continuous designs such as in wallpaper, decoration and gift-wrapping paper, and other continuous designs such as tablecloths, etc. CITR sleeves enable flexographic printing to be more competitive with gravure and offset printing processes on print quality. A typical CITR photopolymer sleeve generally comprises a sleeve carrier (support layer) and at least one unexposed photocurable layer on top of the support layer.

The support (or backing) layer lends support to the plate. The support layer can be formed from a transparent or opaque material such as paper, cellulose film, plastic, or metal. Preferred materials include sheets made from synthetic polymeric materials such as polyesters, polystyrene, polyolefins, polyamides, and the like. One widely used support layer is a flexible film of polyethylene terephthalate. In the case of CITR photopolymer sleeves, one preferred support layer is nickel.

The photocurable layer(s) can include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. If desired, more than one photocurable layer may be used.

Photocurable materials generally cross-link (i.e., cure) and harden through radical polymerization in at least some actinic wavelength region. As used herein, actinic radiation is radiation capable of polymerizing, crosslinking or curing the photocurable layer. Actinic radiation includes, for example, amplified (e.g., laser) and non-amplified light, particularly in the UV and violet wavelength regions. One commonly used source of actinic radiation is a mercury arc lamp, although other sources are generally known to those skilled in the art. Flexographic relief image printing elements are produced from photocurable printing blanks by imaging the photocurable printing blank to produce the desired relief image on the surface of the printing element, typically by selectively exposing the photocurable material to actinic radiation, which exposure acts to harden or crosslink the photocurable material in the irradiated areas.

The slip film is a thin layer, which protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate.

In a "digital" or "direct to plate" plate making process, a laser is guided by an image stored in an electronic data file, and is used to create an in situ negative in a digital (i.e., laser ablatable) masking layer, which is typically a slip film which has been modified to include a radiation opaque material. Portions of this "laser ablatable" layer are then ablated by exposing the masking layer to laser radiation at a selected wavelength and power of the laser. Examples of laser ablatable layers are disclosed, for example, in U.S. Pat. No. 5,925, 500 to Yang, et al., and U.S. Pat. Nos. 5,262,275 and 6,238, 837 to Fan, the subject matter of each of which is herein incorporated by reference in its entirety. The benefit of using a laser to create the image is that the printer need not rely on the use of negatives and all their supporting equipment, and can rely instead on a scanned and stored image, which can be readily altered for different purposes, thus adding to the printer's convenience and flexibility.

The printing element is selectively exposed to actinic radiation in one of three related ways. In the first alternative (i.e., analog platemaking), a photographic negative with transparent areas and substantially opaque areas is used to selectively block the transmission of actinic radiation to the printing plate element. In the second alternative (i.e., digital platemaking), the photopolymer layer is coated with an actinic radiation (substantially) opaque layer that is sensitive to laser ablation and a laser is used to ablate selected areas of the actinic radiation opaque layer creating an in situ negative. In a third alternative, a focused beam of actinic radiation is used to selectively expose the photopolymer directly. Any of these alternative methods is acceptable, with the criteria being the ability to selectively expose the photopolymer to actinic radiation thereby selectively curing portions of the photopolymer.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush, the use of an air knife or heat plus a blotter (i.e., thermal development). Thermal development processes work by processing photopolymer printing plates using heat, and the differential melting temperature between cured and uncured photopolymer is used to develop the latent image.

It is highly desirable in the flexographic prepress printing industry to eliminate the need for chemical processing of printing elements in developing relief images in order to go from plate to press more quickly, and processes have been developed whereby photopolymer printing plates are processed using heat and the differential melting temperature between cured and uncured photopolymer is used to develop the latent image. The basic parameters of this process are known, as described in U.S. Pat. Nos. 7,122,295, 6,773,859, 5,279,697, 5,175,072 and 3,264,103, and in WO 01/88615, WO 01/18604, and EP 1239329, the teachings of each of which are incorporated herein by reference in their entirety. These processes allow for the elimination of development solvents and the lengthy plate drying times needed to remove the solvent. The speed and efficiency of the process allow for use in the manufacture of flexographic plates for printing newspapers and other publications where quick turnaround times and high productivity are important.

Once the heated printing element has been processed using heat, uncured photopolymer remaining can be melted or softened and removed. In most instances, the heated printing element is contacted with a material that will absorb or otherwise remove the softened or melted uncured photopolymer. This removal process is generally referred to as "blotting," and is typically accomplished using a screen mesh or an absorbent fabric. Preferably, blotting is accomplished using rollers to bring the material and the heated printing plate element into intimate contact.

Upon completion of the development process (typically thermal or solvent), the printing plate element may be post-exposed to further actinic radiation in the same machine and/or subjected to detackification, and is then cooled and is ready for use.

The resulting surface, after development, has a relief pattern that reproduces the image to be printed and which typically includes both solid areas and patterned areas comprising a plurality of relief dots. After the relief image is developed, the relief image printing element may be mounted on a press and printing commenced.

While various improvements have been suggested to improve image fidelity and solid ink density (SID) in substantially planar relief image printing plates and to produce relief dots having desired geometric characteristics, the inventors of the present invention have determined that it would be desirable to investigate whether some of these same improvements would also demonstrate improved image fidelity, improved achievable SID, and dots having desired geometric characteristics, in cylindrical relief image printing elements.

SUMMARY OF THE INVENTION

It is an object of the present invention to improve image fidelity in cylindrical relief image printing elements.

It is another object of the present invention to improve achievable SID in cylindrical relief image printing elements.

It is still another object of the present invention to produce printing dots having desired geometric characteristics, including planarity of the top surface, desired shoulder angle, depth of relief between the printing dots, and desired edge sharpness in cylindrical printing elements.

To that end, in one embodiment the present invention relates generally to a method of creating a plurality of relief dots in a cylindrical photosensitive printing blank during a digital platemaking process, said cylindrical photosensitive printing blank comprising a laser ablatable mask layer disposed on at least one photocurable layer, said cylindrical photosensitive printing blank being mountable on a printing cylinder, the method comprising the steps of:
 a. laser ablating the laser ablatable mask layer to create an in situ negative in the laser ablatable mask layer;
 b. placing a barrier layer on top of the laser ablatable mask layer;
 c. exposing the at least one photocurable layer to actinic radiation through the barrier layer and the in situ negative;
 d. removing the barrier layer; and
 e. developing the imaged and exposed photosensitive printing blank to reveal the relief image therein, said relief image comprising the plurality of relief dots;
wherein the presence of the barrier layer produces printing dots having at least one geometric characteristic selected from the group consisting of a planarity of a top surface of the printing dots, beneficial shoulder angle of the printing dots and edge sharpness of the printing dots, changed in relation to dots formed without the use of a barrier layer.

BRIEF DESCPRIPTION OF THE FIGURES

DETAILED DESCRIPTION OF THE PREFERRED EMBODIMENTS

Figure 1:
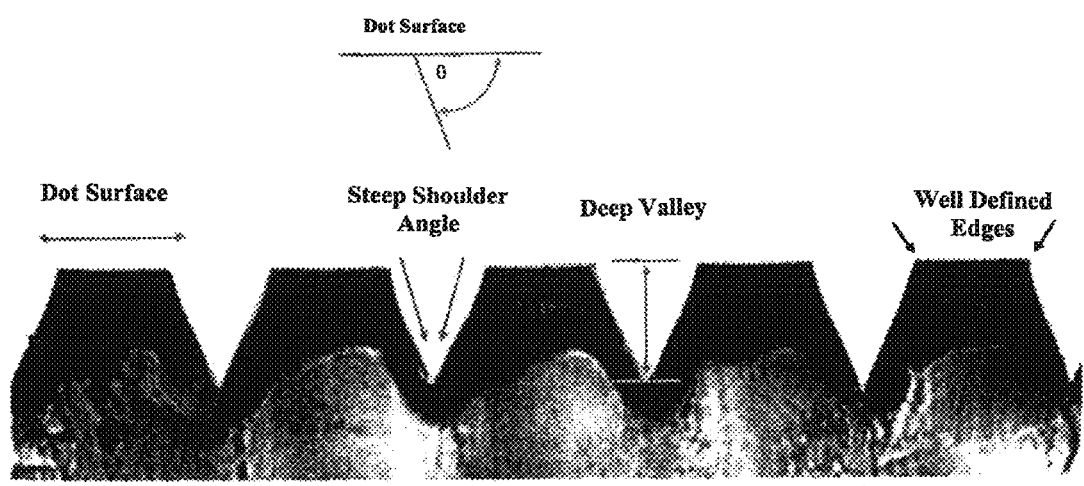
FIG. 1 depicts a particular set of beneficial geometric characteristics for relief printing dots produced in accordance with the present invention.

The inventors of the present invention have found that the use of a barrier layer during the imaging and exposing steps produces printing dots having at least one geometric characteristic selected from the group consisting of planarity of a top surface of the printing dots, shoulder angle of the printing dots and edge sharpness of the printing dots beneficially changed in relation to dots formed without the use of a barrier layer.

To that end, in a preferred embodiment, the present invention relates generally to a method of creating a plurality of relief dots in a cylindrical photosensitive printing blank during a digital platemaking process, said cylindrical photosensitive printing blank comprising a laser ablatable mask layer disposed on at least one photocurable layer, said cylindrical photosensitive printing blank being mountable on a printing cylinder, the method comprising the steps of:
 a. laser ablating the laser ablatable mask layer to create an in situ negative in the laser ablatable mask layer;
 b. placing a barrier layer on top of the laser ablatable mask layer;

c. exposing the at least one photocurable layer to actinic radiation through the barrier layer and the in situ negative;

d. removing the barrier layer; and e. developing the imaged and exposed photosensitive printing blank to reveal the relief image therein, said relief image comprising the plurality of relief dots;

wherein the presence of the barrier layer produces printing dots having at least one geometric characteristic selected from the group consisting of planarity of a top surface of the printing dots, shoulder angle of the printing dots and edge sharpness of the printing dots, beneficially changed in relation to dots formed without the use of a barrier layer.

As described herein, the inventors of the present invention have discovered that an important method of beneficially changing and/or tailoring the shape of printing dots formed on a printing element is accomplished by limiting the diffusion of air into the photocurable layer during exposure to actinic radiation.

The barrier layer may be laminated to the surface of the printing plate using pressure and/or heat in a typical lamination process. In one embodiment, the barrier layer is laminated to the top of the laser ablatable mask layer after the in situ negative has been created therein and, thereafter the at least one photocurable layer is exposed to actinic radiation through the in situ negative. In another embodiment, the barrier layer is laminated to the top of the laser ablatable mask layer and then the in situ negative is created therein. In either instance, the barrier layer is removed from the top of the laser ablatable mask layer before the development step. The lamination step typically comprises bringing the cylindrical photosensitive printing blank into contact with a heated roll, then precisely cutting the barrier layer film to cover the laser ablatable mask layer and laminating the barrier layer to the printing sleeve.

In the alternative, in another embodiment the barrier layer is shrink wrapped using a shrink wrapping technique to wrap the barrier layer around the cylindrical photosensitive printing blank. A seamed shrink sleeve that comprises the barrier layer may be manufactured from a flat configuration of the barrier layer which is then seamed into a tube by attaching the barrier layer to itself to form a tube having a seam, for example by using an adhesive or heat. In the alternative, a seamless shrink sleeve that comprises the barrier layer may be manufactured by extruding the barrier layer in a tube configuration having a desired tube configuration. The resulting tube may be cut to desired lengths to form individual shrink sleeves. Once the barrier layer has been configured into a shrink sleeve or merely loosely wrapped around the cylindrical photosensitive printing blank, it may be exposed to heat to activate the shrink characteristics of the barrier layer and thereby place it into intimate contact with the cylindrical photosensitive printing blank.

The inventors have found that a particular set of geometric characteristics define a flexo dot shape that yields superior printing performance, as shown in FIG. 1. These geometric parameters include, but are not limited to, (1) planarity of the dot surface; (2) shoulder angle of the dot; (3) depth of relief between the dots; and (4) sharpness of the edge at the point where the dot top transitions to the dot shoulder. These geometric parameters are described in more detail in related patent application Ser. No. 12/571,523 to Recchia and Ser. No. 12/660,451 to Recchia et al., the subject matter of each of which is herein incorporated by reference in its entirety.

Figure 2:
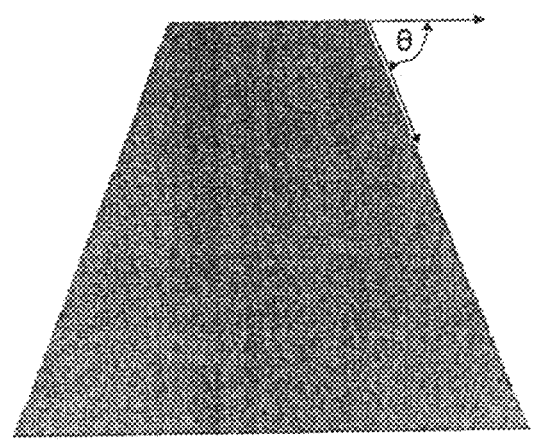
FIG. 2 depicts the measurement of the dot shoulder angle $\theta$.
Figure 3:
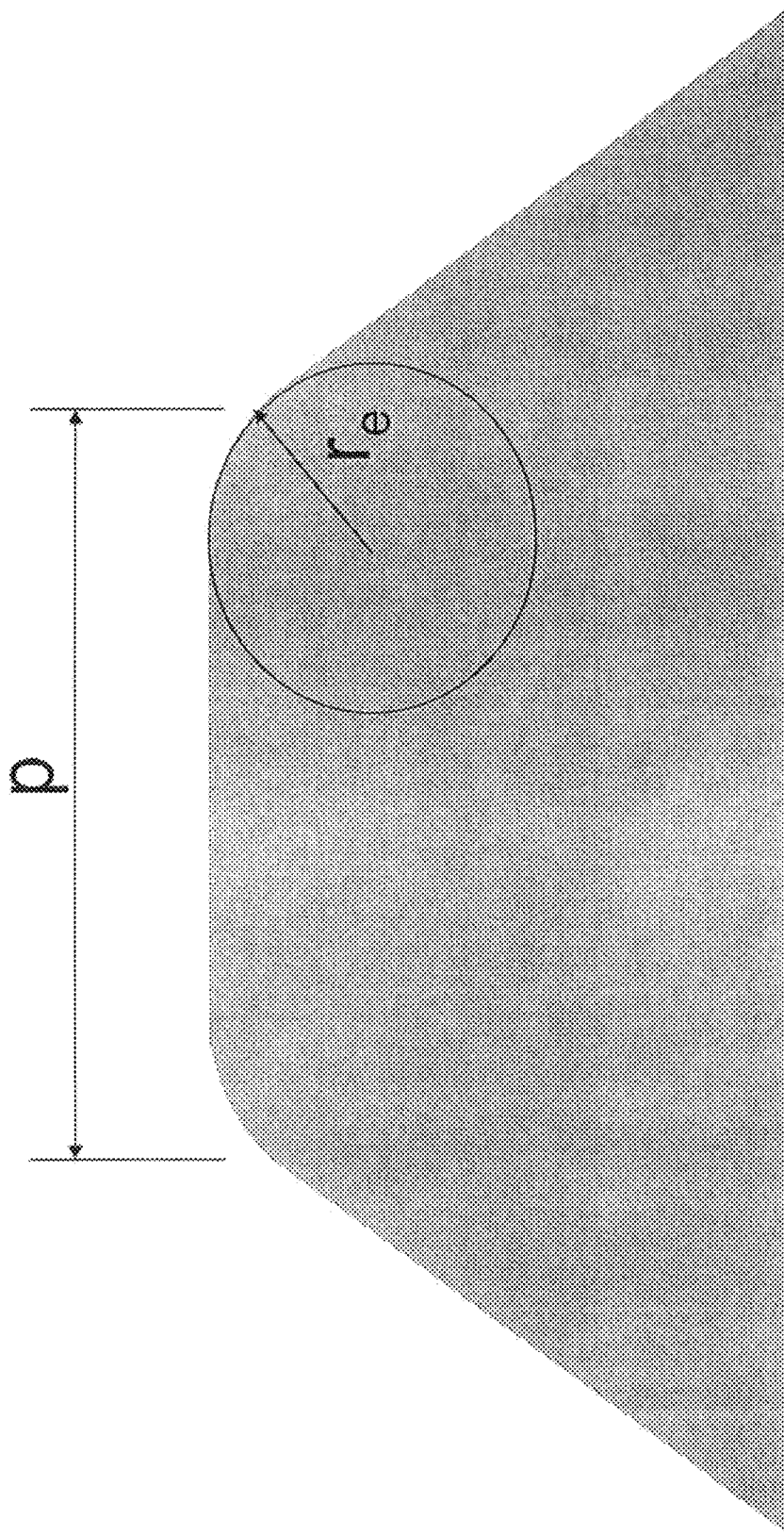
FIG. 3 depicts a flexo dot and its edge, where p is the distance across the dot top. This is used in the characterization of edge sharpness $r_e$:p where $r_e$ is the radius of curvature at the intersection of the shoulder and the top of the dot.

In one preferred embodiment the shoulder angle of the printing dots created by the method described herein is greater than 50°, preferably greater than about 70°, as depicted in FIG. 2. In addition, the edge sharpness of the printing dots created by the method described herein, defined as a ratio of the radius of curvature at the intersection of the shoulder and a top of the relief dot ($r_e$) to the width of the dot's top or printing surface (p) is preferably less than 5%, more preferably, less than 2%, as depicted in FIG. 3.

Altering the type, power and incident angle of illumination can also be useful and can be accomplished by multiple methods. A fully coherent (e.g., laser) light source can be used for exposure. Examples of the laser light sources include UV laser diodes used in devices such as the Lüscher Xpose! imager and the Heidelberg Prosetter imager. Other light sources that can alter the type, power and incident angle of illumination can also be used in the practice of the invention.

Exposure under an oxygen barrier membrane (i.e., barrier layer) has been demonstrated to provide good results, and the most preferred oxygen barrier membranes are clear films that minimize light scattering. Films such as polypropylene, polyethylene, polyvinyl chloride, polyester and similar clear films can serve well as barrier layers. In one preferred embodiment, the barrier membrane comprises a polypropylene film or a polyethylene terephthalate film. One particularly preferred barrier membrane is a Fuji® Final Proof receiver sheet membrane available from Fuji Films.

Another type of barrier layer is a liquid barrier in which the cylindrical photosensitive printing blank may be covered with a layer of liquid, such as a layer of oil, prior to the exposure step, and the oil may be either clear or tinted. The liquid or oil here serves as another form of a barrier layer. As with the solid barrier membrane, it is important that the liquid used be optically transparent to the actinic radiation used to expose the photosensitive layer.

Three qualities that the inventors have identified in producing effective barrier layers include optical transparency, low thickness and oxygen transport inhibition. The barrier layer needs to have a sufficient optical transparency so that the barrier layer will not detrimentally absorb or deflect the actinic radiation used to expose the cylindrical photosensitive printing blank. As such it is preferable that the barrier membrane have an optical transparency of at least 50%, most preferably at least 75%. Oxygen transport inhibition is measure in terms of a low oxygen diffusion coefficient. As noted, the oxygen diffusion coefficient of the membrane (or the liquid layer) should be less than $6.9 \times 10^{-9}$ m$^2$/sec., preferably less than $6.9 \times 10^{-10}$ m$^2$/sec. and most preferably less than $6.9 \times 10^{-11}$ m$^2$/sec.

In the case of using an oxygen barrier membrane as the barrier layer, the barrier membrane thickness should be consistent with the structural needs for handling of the film and the film/photopolymer plate combination. Barrier membrane thicknesses between about 5 and 300 microns are preferred, more preferably between about 10 and about 200 microns, and most preferably between about 1 and 20 microns. The barrier membrane needs to be sufficiently impermeable to oxygen diffusion so that it can effectively limit diffusion of oxygen into the photocurable layer during exposure to actinic radiation. The inventors herein have determined that the barrier membrane materials described herein are capable of substantially limiting the diffusion of oxygen into the photocurable layer.

In addition to limiting the diffusion of oxygen into the photocurable layer, the bather can be used to impart or impress a desired texture to the printing surfaces of the cylindrical photosensitive printing element or to control the surface roughness of the printing surfaces of the printing element to a desired level. In one embodiment of the present invention, the barrier comprises a matte finish and the texture of the matte finish may be transferred to the printing element surface to provide a desired surface roughness on the surface of the printing element. For example, in one embodiment, the matte finish provides an average surface roughness that is between about 700 and about 800 nm. In this instance the barrier comprises a polypropylene film with a cured photopolymer layer thereon and the cured photopolymer layer has a defined topographic pattern defined thereon. The texture or roughness of the barrier membrane surface will be impressed into the surface of the photopolymer (photocurable) layer during the lamination step. In general, surface roughness in this regard can be measured using a Veeco Optical Profilometer, model Wyko NT 3300 (Veeco Instruments, Plainville, N.Y.). In another embodiment of the present invention, the barrier comprises a smooth nanotechnology film with a roughness of less than 100 nm, and the average surface roughness of the printing plate can be controlled to less than about 100 nm.

In the case of the liquid barrier layer, a liquid layer from 1 µm to 100 µm in thickness comprising any of the following oils will meet the foregoing criteria: paraffinic or naphthenic hydro-carbon oils, silicone oils and vegetable based oils. In a preferred embodiment, the liquid is spread upon the surface of the cylindrical photosensitive printing element before the printing element is exposed to actinic radiation. The liquid must also be viscous enough to remain in place during processing.

In one embodiment, flat sheet elements with laser ablatable masks disposed thereon can be used to form seamless, semicontinuous imaging elements. The flat sheet elements are cut to size and wrapped around a cylindrical form, usually a printing sleeve or the printing cylinder itself, and the edges are fused together to form a seamless, continuous element prior to imaging of the laser ablatable (digital) mask by a laser. A longitudinal seam is created by this process, which is often referred to as "plate-on-sleeve." This seam can be straight across the surface of the sleeve or cylinder, or can be made in an infinite variety of shapes through the use of manual or automated cutting methods. However, if care is not taken to cover the photocurable surfaces exposed by the cutting process with a material that is opaque to the UV radiation used to expose the plate, a phenomenon called "edge cure" can result.

Cylindrical photosensitive printing blanks can be prepared in a variety of ways. One way is to wrap a flat photosensitive printing blank around a cylindrical sleeve. Once the photosensitive printing element is laminated to the printing sleeve, the edges of the photosensitive printing element are connected to make a continuous printing sleeve. For example, a combined pressure and heat treatment may be used. Other attempts have focused on sealing the gap between abutting edges by inserting filling materials such as adhesive cement or filling compositions based on rubber, polyacrylate or epoxy resins and the like. More recently, as discussed in U.S. Patent Application Publication No. 2004/0060647 to Tabora, the subject matter of which is herein incorporated by reference in its entirety, a process has been developed for microcutting edges of a photosensitive printing element to create an essentially seamless joint (or break) between the lead edge and trailing edge of the printing element that is then mounted on a printing cylinder.

In another embodiment, the gap that has been created between the ends of the photosensitive printing element can be filled or injected to weld the seam together. The filler material preferably comprises a photosensitive composition that is the same as the composition that is used in the photosensitive printing element. The filler material is typically molten and is injected into the gap created between the two ends of the photosensitive printing element and then hardens or solidifies to create a continuous photosensitive printing element. The filler material may be injected into the gap using various means that precisely dispense or meter the required amount of material. Excess filler is then removed from the photosensitive printing element to provide a desired thickness of the photosensitive printing element, which may be accomplished by squeegeeing off excess material or grinding the photosensitive printing element to the desired thickness.

In the case of these "plate-on-sleeve" printing elements, the barrier layer is most preferably laminated or otherwise disposed thereon after the cutting and wrapping steps have been completed.

In another embodiment, a hollow cylindrical printing sleeve with an integral imageable printing surface can be used, as described for example in U.S. Pat. No. 6,966,259 to Kanga, the subject matter of which is herein incorporated by reference in its entirety, and which typically comprises the following elements:

(1) a hollow cylindrical base made of a high strength polymer resin, which is optionally fiber reinforced;
(2) a first photocurable layer (floor layer) comprising a photopolymerizable resilient material;
(3) one or more second photocurable layers (imageable layer); and
(4) optionally, a masking layer which absorbs radiation at the wavelengths used to polymerize the photoimageable material but is selectively removable by laser ablation or other equivalent means.

In order to make a seamless layer, a second layer of photocurable material is applied to the first layer of photocurable material by spreading, dipping, casting, extruding or molding. The thickness is controlled either by using a knife, die or mold as appropriate. If necessary, the precise thickness of the second layer(s) of photocurable material can be adjusted via grinding, sanding or other machining. If desired, more than one layer can be sequentially applied.

On top of the second layer of photocurable material is preferably, a laser ablatable masking layer, which allows for the selective polymerization of the second layer of photocurable material as described herein. The barrier layer is then applied over the masking layer after the masking layer has already been ablated in the desired image.

After the cylindrical photosensitive printing element has been selectively imaged and exposed through the barrier layer and the barrier layer has thereafter been removed, the printing element is developed to remove uncrosslinked photopolymer material and reveal the relief image therein.

In one embodiment, the printing element is developed by solvent washing as is well known in the art.

In another embodiment, the photosensitive printing element may be subjected to a thermal development process. Various thermal developing systems are known as described, for example in U.S. Pat. No. 7,041,432 to Markhart and in U.S. Pat. Nos. 7,081,331, 7,232,649 and 7,237,482 to Vest, the subject matter of each of which is herein incorporated by reference in its entirety, and generally comprise:

(i) means to support, and preferably cycle or rotate, the photosensitive printing element (printing sleeve); and
(ii) means for thermally developing the photosensitive printing element, wherein the thermally developing means typically comprises:
 a) means for softening or melting non-crosslinked photopolymer on the surface of the photosensitive printing element;
 b) at least one roll that is contactable with the surface of the photosensitive printing element and capable of moving over at least a portion of the surface of the photosensitive printing element to remove the softened or melted non-crosslinked photopolymer on the surface of the photosensitive printing element; and c) means for maintaining contact between the at least one roll and the surface of the photosensitive printing element.

The thermal developing system preferably comprises a blotting material positioned on at least a portion of the at least one roll. Thus, when the at least one roll is heated and is contacted with the imaged surface of the photosensitive printing element, non-crosslinked polymer on the imaged surface of the photosensitive printing element is melted by the heated roll and is removed by the blotting material.

Yet another consideration in processing cylindrical photosensitive printing elements to achieve good printing results is the creation of a floor layer in the cylindrical printing element. The purpose of the floor layer is to ensure that the imageable layer has excellent adhesion and remains firmly attached to the base layer even when very fine isolated structures are developed in the imageable layer. Creation of the floor layer is typically accomplished by back exposing the photoimageable layer through the backing layer to create a cured portion in the photoimageable layer which sets the depth of relief during the subsequent imaging and exposing steps. However, in the case of cylindrical relief image printing elements, especially continuous-in-the-round printing sleeves, this step can be difficult to accomplish.

Therefore, in one embodiment, a pre-cured floor layer can be formed in the printing element during the manufacturing step. By pre-curing the first layer using flood exposure techniques, the floor layer on the resultant printing element is more uniform from side to side. As a result, the image fidelity of the printing element is more pure, with fewer inconsistencies in the image areas across the sleeve. Furthermore, by pre-curing the first layer, the resultant floor layer is generally more tack free, reducing the tendency to build up ink, lint, and debris during the printing and storage process. The pre-cured floor also provides a distinct aesthetic advantage in the finished printing element, providing a smooth texture across the surface of the floor, as opposed to the rough surface often associated with thermally processed printing elements. Such an appearance can lend itself to better clarity during sleeve inspection, improving the customer's ability to quality control their processes. Finally, a pre-cured floor provides the end user with a true limit to their processing capability, in other words, there is no uncured material remaining after processing is complete. Thus, pre-curing of the floor can be done by frontal face exposure prior to the application of the imageable layer, thus eliminating the need for back exposure and the quality variations caused thereby.

A key advantage of the use of a pre-cured floor layer is that back exposure is no longer required, thus eliminating problems resulting from back exposure variance.

Furthermore, there is an obvious time savings resulting from not requiring the back exposure step.

Thus it can be seen that the use of a barrier layer during processing of a cylindrical printing element can produce printing dots having desired geometric characteristics as well as good image fidelity and improved achievable solid ink density. Furthermore, other techniques used for processing cylindrical printing sleeves can also be used in combination with the barrier layer to achieve a good result.

What is claimed is:

1. A method of creating a plurality of relief dots in a cylindrical photosensitive printing blank during a digital platemaking process, said cylindrical photosensitive printing blank comprising a laser ablatable mask layer disposed on at least one photocurable layer, said cylindrical photosensitive printing blank being mountable on a printing cylinder, the method comprising the steps of:

a. laser ablating the laser ablatable mask layer to create an in situ negative in the laser ablatable mask layer;

b. placing a barrier layer on top of the laser ablatable mask layer;

c. exposing the at least one photocurable layer to actinic radiation through the barrier layer and the in situ negative;

d. removing the barrier layer; and e. developing the imaged and exposed photosensitive printing blank to reveal the relief image therein, said relief image comprising the plurality of relief dots.

2. The method according to claim 1, wherein the barrier layer is laminated to the top of the laser ablatable mask layer.

3. The method according to claim 1, wherein the barrier layer is shrink wrapped over the laser ablatable mask layer.

4. The method according to claim 1, wherein the shoulder angle of the relief dots is greater than 50°.

5. The method according to claim 4, wherein the shoulder angle of the relief dots is greater than about 70°.

6. The method according to claim 1, wherein an edge sharpness of the relief dots is such that a ratio of radius of curvature at the intersection of the shoulder and the top surface of the dot, $r_e$, to the width of the top of the dot, p, is less than 5%.

7. The method according to claim 6, wherein an edge sharpness of the relief dots is such that the ratio of radius of curvature at the intersection of the shoulder and the top surface of the dot, $r_e$, to the width of the top of the dot, p, is less than 2%.

8. The method according to claim 1, wherein the barrier layer is an oxygen barrier membrane.

9. The method according to claim 8, wherein the oxygen barrier membrane comprises a material selected from the group consisting of polyamides, polyvinyl alcohol, hydroxyalkyl cellulose, polyvinyl pyrrolidone, copolymers of ethylene and vinyl acetate, amphoteric interpolymers, cellulose acetate butyrate, alkyl cellulose, butyral, cyclic rubbers, and combinations of one or more of the foregoing.

10. The method according to claim 8, wherein the oxygen barrier membrane comprises a film that is optically transparent to the actinic radiation used to expose the at least one photocurable layer, said film selected from the group consisting of polypropylene, polyethylene, polyvinyl chloride, polyester and combinations of one or more of the foregoing.

11. The method according to claim 10, where the oxygen barrier membrane comprises a polypropylene film or a polyethylene terephthalate film.

12. The method according to claim 1, wherein the barrier layer is a liquid layer that is optically transparent to the actinic radiation used to expose the at least one photocurable layer.

13. The method according to claim 12, wherein the liquid layer comprises a paraffinic or naphthenic hydrocarbon oil, silicone oil or a vegetable-based oil.

14. The method according to claim 1, wherein the cylindrical photosensitive printing blank is seamless.

15. The method according to claim 14, wherein the cylindrical photosensitive printing blank is subjected to a blanket pre-curing through the front to establish a floor layer.

16. The method according to claim 1, wherein step (e) comprises thermal development.

17. The method according to claim 1, wherein the cylindrical photosensitive printing blank comprises a photopolymer printing blank wrapped around a printing sleeve.

\* \* \* \* \*